United States Patent
Lim et al.

(10) Patent No.: US 8,772,887 B2
(45) Date of Patent: Jul. 8, 2014

(54) MAGNETIC DEVICE

(75) Inventors: Woo-Chang Lim, Hwaseong-si (KR);
Jang-Eun Lee, Suwon-si (KR);
Se-Chung Oh, Suwon-si (KR); Woo-Jin Kim, Yongin-si (KR); Young-Hyun Kim, Seoul (KR); Jeong-Heon Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/475,520

(22) Filed: May 18, 2012

(65) Prior Publication Data
US 2012/0292724 A1    Nov. 22, 2012

(30) Foreign Application Priority Data

May 19, 2011    (KR) .................. 10-2011-0047416

(51) Int. Cl.
*H01L 29/82*    (2006.01)
*H01L 43/00*    (2006.01)
(52) U.S. Cl.
USPC .................................. 257/421; 257/E29.323
(58) Field of Classification Search
USPC .......................................... 257/421, E29.323
See application file for complete search history.

(56) References Cited

U.S. PATENT DOCUMENTS

| | | | |
|---|---|---|---|
| 6,794,695 B2* | 9/2004 | Sharma et al. | 257/295 |
| 6,919,594 B2* | 7/2005 | Sharma et al. | 257/295 |
| 2004/0257865 A1* | 12/2004 | Honjo et al. | 365/171 |
| 2005/0219769 A1* | 10/2005 | Shimura et al. | 360/324.2 |
| 2006/0125034 A1* | 6/2006 | Ohba et al. | 257/421 |
| 2009/0080239 A1* | 3/2009 | Nagase et al. | 365/158 |
| 2009/0195918 A1* | 8/2009 | Aoyama | 360/77.08 |
| 2010/0072524 A1* | 3/2010 | Huai et al. | 257/295 |
| 2010/0221580 A1* | 9/2010 | Wang et al. | 428/828 |
| 2011/0303995 A1* | 12/2011 | Worledge | 257/421 |

FOREIGN PATENT DOCUMENTS

| | | |
|---|---|---|
| JP | 2004-071897 | 3/2004 |
| JP | 2010-016408 | 1/2010 |
| KR | 1020030085496 A | 11/2003 |

* cited by examiner

*Primary Examiner* — David S Blum
(74) *Attorney, Agent, or Firm* — Renaissance IP Law Group LLP

(57) ABSTRACT

A magnetic tunnel junction element is provided. The magnetic tunnel junction element has first magnetic layer and second magnetic layer formed adjacent, e.g., on lower and upper portions of an insulating layer, respectively and each having a perpendicular magnetic anisotropy, a magnetic field adjustment layer formed on the second magnetic layer and having a perpendicular magnetic anisotropy, and a bather layer formed between the magnetic field adjustment layer and the second magnetic layer. The second magnetic layer and the magnetic field adjustment layer are magnetically decoupled from each other.

17 Claims, 14 Drawing Sheets

$$\vec{F_1} + \vec{F_2} + \vec{F_3} + \vec{F_4} \approx 0$$

MAGNETIC DEVICE

CROSS-REFERENCE TO RELATED APPLICATIONS

This application is based on and claims priority from Korean Patent Application No. 2011-0047416, filed on May 19, 2011 in the Korean Intellectual Property Office, the disclosure of which is incorporated herein in its entirety by reference.

BACKGROUND

1. Technical Field

The present disclosure generally relates to a magnetic device, and more particularly to a magnetic element such as a magnetic tunnel junction (MTJ) element.

2. Related Art

Nonvolatile memory devices which use a resistance material to store a data state include a phase change random access memory (PRAM), a resistive RAM (RRAM), a magnetic RAM (MRAM), and the like. A dynamic RAM (DRAM) or flash memory device stores data using electrical charges, whereas a nonvolatile memory device having a resistance material stores data using the variable states of the resistance material, for instance, using a phase change of a phase change material such as a chalcogenide alloy (in the case of a PRAM), a resistance change of a variable resistance material (in the case of an RRAM), or a resistance change of a magnetic tunnel junction (MTJ) depending on a magnetization state of a ferromagnetic material (in the case of an MRAM).

An MTJ element typically has a pinned layer formed of a ferromagnetic material and a free layer formed of a ferromagnetic material, which are separated from each other by an insulating layer that is used as a tunnel barrier. At an edge of the ferromagnetic material, a stray field may be generated. This stray field may lower the magnetic resistance or increase the coercive force of the free layer, and exert an influence on the switching characteristic to form asymmetric switching. Accordingly, there is a need for a structure that can reduce or remove the stray field that is generated in the ferromagnetic material of the MTJ element.

SUMMARY

Accordingly, the present disclosure describes various inventive concepts which have been designed to solve the above-mentioned problems occurring in conventional magnetic tunneling junction (MTJ) devices, and the inventive principles also provide a MTJ having reduced stray field and improved operational properties.

Additional advantages, objects, and features of the inventive principles will be set forth in part in the description which follows. Additional aspects and advantages will become apparent to those having ordinary skill in the art upon examination of the following disclosure and further benefits may be learned from practice of the inventive concepts.

BRIEF DESCRIPTION OF THE DRAWINGS

The above and other features and advantages of the present disclosure will be more to apparent from the following detailed description taken in conjunction with the accompanying drawings, in which.

DETAILED DESCRIPTION OF THE EMBODIMENTS

Figure 1:
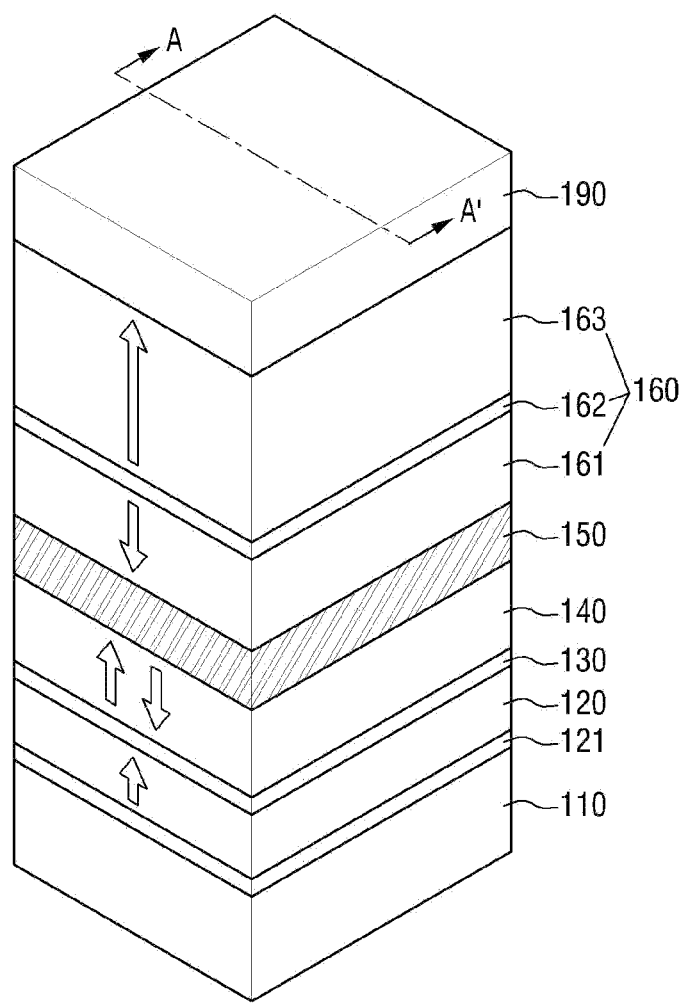
FIG. 1 is a schematic view of a magnetic tunnel junction (MTJ) element according to a first embodiment of the present inventive concept.

The present disclosure will now be described more fully hereinafter with reference to the accompanying drawings, in which preferred embodiments incorporating the inventive principles are shown. The principles of this invention may, however, be embodied in many different forms and should not be construed as limited to the specific embodiments set forth herein. Rather, these embodiments are provided so that this disclosure will be thorough and complete, and will fully convey the scope of the invention to those skilled in the art. The same reference numbers indicate the same or similar components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the specific orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The use of the terms "a" and "an" and "the" and similar referents in the context of describing the inventive principles (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise expressly noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the present inventive principles and is not a limitation on the scope of the inventive concept unless otherwise specified. Furthermore, unless specifically defined otherwise, all terms defined in generally-used dictionaries should to be given their ordinary and accustomed meanings.

The present inventive principles will be described with reference to perspective views, cross-sectional views, and/or plan views, in which preferred embodiments incorporating the inventive concepts are shown. The profiles of these exemplary views may be modified according to manufacturing techniques and/or allowances. That is, the specific depictions of the embodiments disclosed herein are not intended to limit the scope of the present inventive principles, but rather, the present inventive principles should be interpreted to cover all changes and modifications that can result from changes in the manufacturing process. Thus, regions shown in the drawings are illustrated in schematic form and the shapes of the regions are presented simply by way of illustration and should not be taken as limitations.

Hereinafter, embodiments of the present disclosure will be described in detail with reference to the accompanying drawings.

Figure 2:
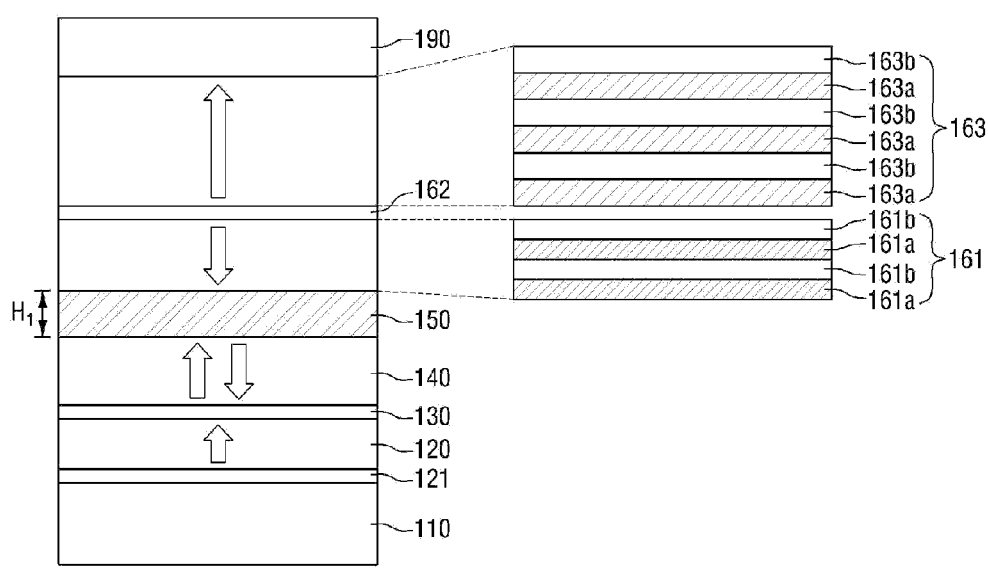
FIG. 2 is a schematic cross-sectional view taken along line A-A' of FIG. 1.
Figure 3:
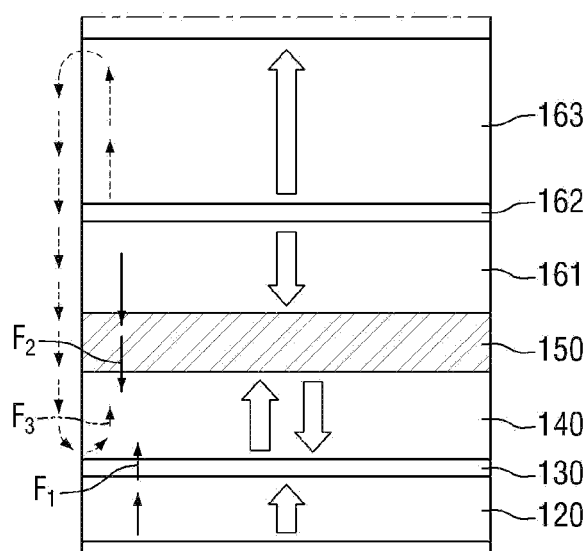
FIG. 3 is a cross-sectional view of a portion of the MTJ element of FIG. 1, schematically illustrating a stray field applying state in the MTJ element.

Referring to FIGS. 1 to 4, a magnetic tunnel junction (MTJ) element according to a first embodiment of the present disclosure will be described. FIG. 1 is a schematic view of an MTJ element constructed according to various inventive principles, and FIG. 2 is a cross-sectional view taken along line A-A' of FIG. 1. FIG. 3 is a cross-sectional view of a portion of the MTJ element of FIG. 1, schematically illustrating a stray field applying state in the MTJ element of this embodiment. FIGS. 4A and 4B are schematic cross-sectional views illustrating various configurations for a barrier layer of the MTJ element of FIG. 1.

First referring to FIGS. 1 and 2, the MTJ element according to this embodiment includes a first magnetic layer 120 formed overlying a substrate 110, an insulating layer 130, a second magnetic layer 140, a barrier layer 150, and a magnetic field adjustment layer 160. The MTJ element may further include a seed layer 121 formed below the first magnetic layer 120, and a protection layer 190 formed on the magnetic field adjustment layer 160.

The substrate 110 may include, for example, a silicon semiconductor substrate, a gallium arsenide semiconductor substrate, a silicon germanium semiconductor substrate, a ceramic semiconductor substrate, a quartz semiconductor substrate, a glass semiconductor substrate for display, or other appropriate substrate.

The first magnetic layer 120 preferably has a magnetic anisotropy that is perpendicular to its plane or a film surface thereof (perpendicular anisotropy). As used herein, "perpendicular" may correspond to a direction that is substantially perpendicular to one or more of the layers of the MTJ. The first magnetic layer 120 may also have a magnetization that is pinned in one direction. Optionally, a pinning layer (not shown) may to be formed adjacent the first magnetic layer 120. For example, the magnetization may be pinned in a direction that travels from a lower portion of the first magnetic layer 120 to an upper portion thereof. Hereinafter, for purposes of this disclosure only, and not by way of limitation in the claims, the direction that travels from the lower portion of the first magnetic layer 120 toward the upper portion thereof is referred to as "a first direction," and an opposite direction travelling from the upper portion thereof toward the lower portion thereof is referred to as "a second direction." Referring to FIG. 3, a stray field $$(\overrightarrow{F_1})$$

that is generated from the first magnetic layer 120 may be applied to the second magnetic layer 140 in the first direction.

The first magnetic layer 120 may be formed of a ferromagnetic material. For example, an amorphous base rare earth element alloy, a multilayer thin film in which a ferromagnetic metal (FM) and a nonmagnetic metal (NM) are alternately laminated, an alloy having an L10 type crystal structure, or a cobalt base alloy may be used. Specifically, as the amorphous base rare earth element alloy, an alloy, such as TbFe, TbCo, TbFeCo, DyTbFeCo, or GdTbCo, may be used. As the multilayer thin film in which the ferromagnetic metal and the nonmagnetic metal are alternately laminated, Co/Pt, Co/Pd, CoCr/Pt, Co/Ru, Co/Os, Co/Au, or Ni/Cu may be used. Further, as the alloy having the L10 type crystal structure, $Fe_{50}Pt_{50}$, $Fe_{50}Pd_{50}$, $Co_{50}Pt_{50}$, $Fe_{30}Ni_{20}Pt_{50}$, or $Co_{30}Ni_{20}Pt_{50}$ may be used, but the alloy is not limited thereto. Further, as the cobalt base alloy, CoCr, CoPt, CoCrPt, CoCrTa, CoCrPtTa, CoCrNb, or CoFeB may be used, and more specifically, the first magnetic layer 120 may be formed as a CoFeB single layer.

The second magnetic layer 140 may be formed overlying the first magnetic layer 120 with the insulating layer 130 disposed therebetween. The second magnetic layer 140 may also have a perpendicular magnetic anisotropy, i.e., a magnetic anisotropy that is perpendicular to its plane or the film surface thereof. The second magnetic layer 140, however has a magnetization that may not be pinned in any direction, and may instead be switchable from one direction to the other direction. That is, the magnetization direction of the second magnetic layer 140 may either be arranged parallel to or anti-parallel to the magnetization direction of the first magnetic layer 120. Therefore, the MTJ element may be configured such that the second magnetic layer 140 is switchable between a plurality of stable magnetic states when a write current is passed through the MTJ element. A resistance value for the MTJ element changes depending on the direction of magnetization of the second magnetic layer 140 in relation to the first magnetic layer 120. Thus, the MTJ element to may be used as a memory element in a memory device by associating each of the two resistance values that correspond to the magnetization arrangement of the first magnetic layer 120 in relation to the second magnetic layer 140 with data information of either "0" or "1". For example, if the magnetization direction of the second magnetic layer 140 is parallel to that of the first magnetic layer 120, the resistance value of the magnetic tunnel junction element becomes small, and this arrangement is given a data value of "0". If the magnetization direction of the second magnetic layer 140 is anti-parallel to that of the first magnetic layer 120, the resistance value of the magnetic tunnel junction element becomes large, and this case is given a data value of "1".

The second magnetic layer 140 may be formed of a ferromagnetic material. For example, an amorphous base rare earth element alloy, a multilayer thin film in which ferromagnetic metal (FM) and nonmagnetic metal (NM) are alternately laminated, or an alloy having an L10 type crystal structure may be used. The second magnetic layer 140 may be formed of the same ferromagnetic material as the first magnetic layer 120, and specifically, may be formed as a CoFeB single layer.

The second magnetic layer 140 may be formed having a thickness of about 15 Å or more, and specifically, may be formed having a thickness of between about 15 Å to about 25 Å. By forming the second magnetic layer 140 having a thickness within the above-described range, the perpendicular anisotropy of the second magnetic layer 140 can be increased, and the second magnetic layer 140 can be more easily magnetically separated (or decoupled) from the magnetic field adjustment layer 160. That is, by appropriately selecting the thickness of the second magnetic layer 140, the perpendicular anisotropy of the second magnetic layer 140 can become stronger than the magnetic coupling force between the magnetic field adjustment layer 160 and the second magnetic layer 140. The second magnetic layer 140 can thereby be magnetized independently of the magnetic field adjustment layer 160. "Mutual magnetic separation" or "magnetically decoupled" may mean that the magnetization of the second magnetic layer 140 is not affected by the magnetic field adjustment layer 160, and the correlation in magnetization direction between the second magnetic layer 140 and the magnetic field adjustment layer 160 does not exert an influence on the operating state of the MTJ element.

In the embodiment shown in FIGS. 1 to 4, the first magnetic layer 120 and the second magnetic layer 140 are each formed as a CoFeB single layer. Since the CoFeB single layer structure can be formed so that the CoFeB layer is thicker than the multilayer structure in which CoFeB and Co/Pt or Co/Pd are sequentially laminated, the magnetic resistance (MR) ratio can be increased. Further, since CoFeB can be etched easier than a metal such as Pt or Pd, the CoFeB single layer can be processed easier than a multilayer structure containing Pt or Pd.

An insulating layer 130 may be formed between the first magnetic layer 120 and the second magnetic layer 140. The insulating layer 130 may be an insulating tunnel barrier that generates quantum mechanical tunneling between the first magnetic layer 120 and the second magnetic layer 140. The insulating layer 130 may be formed of magnesium oxide ($MgO$), aluminum oxide ($Al_2O_3$), silicon oxide ($SiO_2$), tantalum oxide ($Ta_2O_5$), silicon nitride ($SiN_x$), or aluminum nitride ($AlN_x$), for example.

In some embodiments, the present disclosure may be applied to other magnetic elements having a spin valve, e.g., spin valve STT-MRAM having conductive spacer layers formed of a conductive material such as CR, Ta, Ti, W, and Ru, one example of which is shown in U.S. Pat. No. 7,821, 088, the contents of which are incorporated herein by reference in their entirety. Thus, a nonmagnetic layer such as a nonmagnetic conductive layer may be formed between the first magnetic layer 120 and the second magnetic layer 140. In addition, the present disclosure can be applied to a ballistic magnetoresistance structure. Also, the principles of the present disclosure may be applied to spin logic devices. The spin logic devices may be, for example, all-spin logic (ASL) device and non-volatile spin logic device.

The magnetic field adjustment layer 160 may be formed above the second magnetic layer 140 on the barrier layer 150. The magnetic field adjustment layer 160 serves to minimize the stray field that is applied to the second magnetic field 140 by offsetting or reducing the stray field that is generated in the respective magnetic layers. The magnetic field adjustment layer 160 may be formed of a ferromagnetic material having perpendicular anisotropy.

Referring to FIGS. 1 and 2, the magnetic field adjustment layer 160 can include a third magnetic layer 161, a fourth magnetic layer 163, and a first nonmagnetic layer 162 formed between the third magnetic layer 161 and the fourth magnetic layer 163. In this embodiment, the third magnetic layer 161 is positioned closer to the second magnetic layer 140 than the fourth magnetic layer 163.

The magnetic field adjustment layer 160 may have a synthetic anti-ferromagnetic (SAF) structure in which the third magnetic layer 161 and the fourth magnetic layer 163 are anti-ferromagnetically coupled to each other through the first nonmagnetic layer 162. In this case, the magnetization directions of the third magnetic layer 161 and the fourth magnetic layer 163 are arranged anti-parallel to each other. For example, the third magnetic layer 161 to may be magnetized in a second direction, and the fourth magnetic layer 163 may be magnetized in the first direction.

The third magnetic layer 161 or the fourth magnetic layer 163 may have a structure in which a ferromagnetic metal (FM) and a nonmagnetic metal (NM) are alternately laminated. Specifically, as the ferromagnetic metal, a single metal selected from the group consisting of iron (Fe), cobalt (Co), nickel (Ni) and their alloy may be used, and as the nonmagnetic metal, a single metal selected from the group consisting of chrome (Cr), platinum (Pt), palladium (Pd), iridium (Ir), rhodium (Rh), ruthenium (Ru), osmium (Os), rhenium (Re), gold (Au), copper (Cu) and their alloy may be used. The ferromagnetic metal and the nonmagnetic metal may be alternately laminated. For example, the third magnetic layer 161 or the fourth magnetic layer 163 may be formed of [Co/Pd]n, [Co/Pt]n, or [CoFe/Pt]n (here, n is an integer that is equal to or larger than 1). In this case, the ferromagnetic metal or the nonmagnetic metal may be laminated with a thickness of between about 2 Å to about 10 Å. The exploded views in FIG. 2 show a third magnetic layer 161 formed by alternately laminating a magnetic metal 161*a* (for example, Co) and a nonmagnetic metal 161*b* (for example, Pd) twice, and a fourth magnetic layer 163 formed by alternately laminating a magnetic metal 163*a* (for example, Co) and a nonmagnetic metal 163*b* (for example, Pb) three times.

The first nonmagnetic layer 162 may be formed between the third magnetic layer 161 and the fourth magnetic layer 163, and can be formed of a nonmagnetic material that enables the third magnetic layer 161 and the fourth magnetic layer 163 to be anti-ferromagnetic ally coupled. For example, the first nonmagnetic layer 162 may be formed of a single metal selected from the group consisting of ruthenium (Ru), rhodium (Rh), osmium (Os), rhenium (Re), chrome (Cr) and their alloy.

Hereinafter, referring to FIG. 3, the stray field that is applied to the second magnetic layer 140 will be described. Since the first magnetic layer 120, the third magnetic layer 161, and the fourth magnetic layer 163 are magnetic substances, stray fields $$(\vec{F_1}, \vec{F_2}, \vec{F_3})$$

are generated at their respective edges, and may be applied to the second magnetic layer 140. Since the first magnetic layer 120 and the fourth magnetic layer 163 have parallel magnetization arrangements, the stray fields $$(\vec{F_1}, \vec{F_3})$$

generated from the first magnetic layer 120 and the fourth magnetic layer 163 may be applied to the second magnetic layer 140 in the same direction, i.e., the first direction. Since the magnetization direction of the third magnetic layer 161 is anti-parallel to the first magnetic layer 120, the stray field $$(\vec{F_2})$$

generated from the third magnetic layer 161 may be applied to the second magnetic layer 140 in an opposite direction, i.e., the second direction. In this case, therefore, the combined stray field of $$\vec{F_1} + \vec{F_3}$$

is applied in the first direction, and the stray field of $$\vec{F_2}$$

is applied in the second direction. The strength of the magnetic field exerted by a magnetic layer depends on its proximity. Accordingly, since the third magnetic layer 161 is closer to the second magnetic layer 140 than the fourth magnetic layer 163, the stray field $$(\vec{F_2})$$

generated from the third magnetic layer 161 is applied to the second magnetic layer 140 with a greater strength than the stray field $$(\vec{F_3})$$

generated from the fourth magnetic layer 163. Consequently, by appropriately selecting the respective distances from the second magnetic layer (along with the other magnetic properties of the magnetic layers), the values of $$\vec{F_1} + \vec{F_3} \text{ and } \vec{F_2}$$

can become almost the same, and thus the stray field that is applied to the second magnetic layer 140 may be substantially reduced or offset. Accordingly, the magnetic field adjustment layer 160 serves to offset or adjust the stray field.

In addition to the distance from the second magnetic layer 140, the thicknesses of the third and fourth magnetic layers 161, 163 may also affect the strength of their magnetic fields applied to the second magnetic layer 140. Accordingly, the thicknesses of the magnetic layers may also be selected to minimize the amount of stray field applied to the second magnetic layer 140. For instance, the fourth magnetic layer 163 may be formed to be thicker than the third magnetic layer 161 in order to offset some or all of the stronger stray field that is applied to the second magnetic layer 140 by the closer third magnetic layer 161. As explained previously, the shorter the distance to the second magnetic layer 140, the higher the strength of the stray field that is applied to the second magnetic layer 140. Accordingly, in order to compensate for the closer proximity of the third magnetic layer 161, the fourth magnetic layer 163 may be formed thicker than the third magnetic layer 161.

The barrier layer 150 is formed between the second magnetic layer 140 and the magnetic field adjustment layer 160. The barrier layer 150 serves to magnetically decouple the second magnetic layer 140 and the magnetic field adjustment layer 160 from each other such that substantially no exchange interaction exists between the two layers 140, 160. The barrier layer 150 also preferably further strengthens the perpendicular anisotropy of the second magnetic layer 140. Accordingly, by providing the barrier layer 150, the magnetizations of the magnetic field adjustment layer 160 and the second magnetic layer 140 can occur independently, and it is not necessary to consider their magneto-resistance ratio for operation of the MTJ element.

The thickness $H_1$ of the barrier layer 150 may, for instance, be formed equal to or larger than 10 Å. Specifically, the thickness may be between about 10 Å to about 50 Å, and more specifically, the thickness may be formed between about 20 Å to about 50 Å. In the above-described thickness ranges, the barrier layer 150 may more effectively magnetically decouple the second magnetic layer 140 and the magnetic field adjustment layer 160 from each other, and further reduce the stray field effects.

Figure 4A:
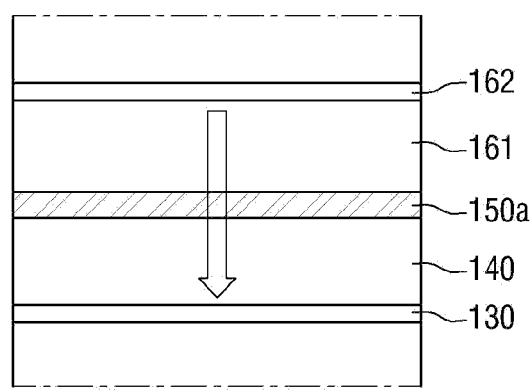
FIGS. 4A and 4B are schematic cross-sectional views of a selected portion of an MTJ element similar to that of FIG. 1, illustrating various design issues for a barrier layer of the MTJ element.
Figure 4B:
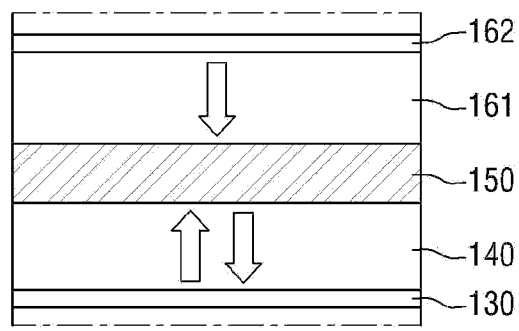

Referring now to FIG. 4A, if the thickness of the barrier layer 150a is less than 10 Å, the third magnetic layer 161 and the second magnetic layer 140 may become magnetically coupled, with the second magnetic layer 140 having substantially the same magnetization direction as that of the third magnetic layer 161. For example, the second magnetic layer 140 and the third magnetic layer 161 may have a magnetization direction arranged in the second direction. However, referring now to FIG. 4B, if the thickness of the barrier layer 150 is equal to or larger than 10 Å, the second magnetic layer 141 may be magnetized independently of the third magnetic layer 161, and may therefore optionally be magnetized in either the first direction or in the second direction, regardless of the direction of magnetization of the third magnetic layer 161.

The barrier layer 150 can therefore enable the second magnetic layer 140 to have its own perpendicular anisotropy, and may further be formed of a material that enables the magnetic field adjustment layer 160 to achieve crystal growth. For example, the barrier layer 150 may be formed of a single metal selected from the group consisting of tantalum (Ta), ruthenium (Ru), titanium (Ti), palladium (Pd), platinum (Pt), magnesium (Mg), aluminum (Al), their alloys, and an oxide of their alloys, for instance.

Referring back to FIG. 1, the first magnetic layer 120 can be formed on the seed layer 121. The seed layer 121 preferably serves to provide the first magnetic layer 120 with perpendicular anisotropy and to pin the magnetization direction of the first magnetic layer 120.

The seed layer 121 may be formed of a material that enables the first magnetic layer 120 to have a perpendicular magnetic anisotropy, and for example, may be formed of a metal or a metal oxide. The metal may, for instance, contain a single metal selected from the group consisting of tantalum (Ta), ruthenium (Ru), titanium (Ti), palladium (Pd), platinum (Pt), magnesium (Mg), aluminum (Al) and their alloy.

On the magnetic field adjustment layer 160, a protection layer 190 may be formed. The protection layer 190 can serve to protect the device, and may be formed of a metal or metal oxide, for instance.

Figure 5:
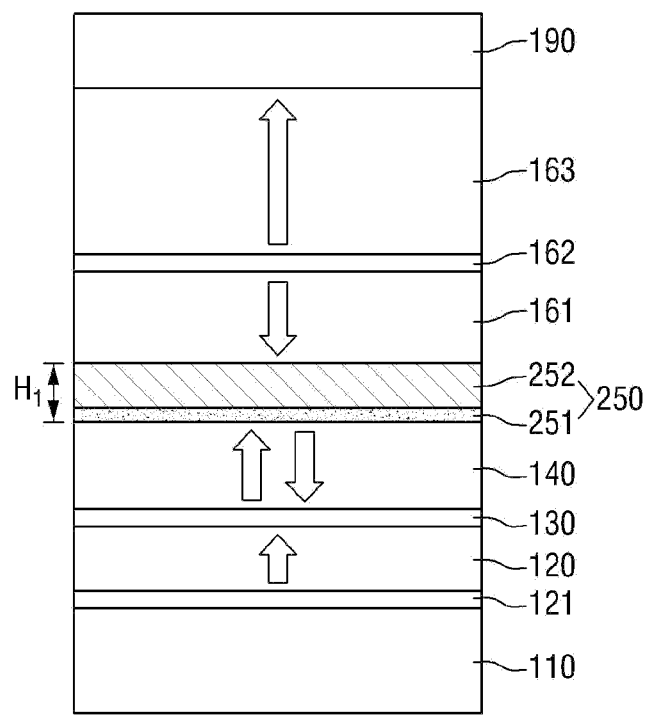
FIG. 5 is a schematic cross-sectional view of a selected portion of an MTJ element, constructed according to an alternative embodiment of the present disclosure.

Hereinafter, referring to FIG. 5, an MTJ element according to a second embodiment of the present disclosure will be described. FIG. 5 is a cross-sectional view of a magnetic tunnel junction element according to the second embodiment of the present disclosure. The same drawing reference numerals are used for the constituent elements which are substantially the same as those according to the first embodiment, and the detailed description of the corresponding constituent elements will be omitted. The magnetic tunnel junction element according to the second embodiment of the present disclosure is different from that according to the first embodiment of the present disclosure on the point that the barrier layer 250 has a laminated structure.

Referring to FIG. 5, the barrier layer 250 may have a structure in which a metal oxide layer 251 and an interlayer metal layer 252 are laminated or sequentially stacked over the second magnetic layer 140.

The metal oxide layer 251 may be formed on an upper portion of the second magnetic layer 140, and may be formed on a lower portion of the interlayer metal layer 252. In other words, the interlayer metal layer 252 may be formed over the metal oxide layer 251. The metal oxide layer 251 strengthens the perpendicular anisotropy of the second magnetic layer 140 and assists the second magnetic layer 140 in being magnetically decoupled from the magnetic field adjustment layer 160. The metal oxide layer 251 may be formed of a single metal selected from the group consisting of tantalum (Ta), ruthenium (Ru), titanium (Ti), palladium (Pd), platinum (Pt), magnesium (Mg), aluminum (Al) and an oxide of their alloys.

The interlayer metal layer 252 is formed on the lower portion of the magnetic field adjustment layer 160 and assists the third magnetic layer 161 and the fourth magnetic layer 163 in growing in desired crystal direction. Specifically, the interlayer metal layer 252 may be formed of a metal that facilitate the crystal growth in the (1,1,1) direction of a face centered cubic (FCC) or in the (0,0,1) direction of a hexagonal close-packed structure (HCP). For example, the interlayer metal layer 252 may be formed of a single metal selected from the group consisting of tantalum (Ta), ruthenium (Ru), titanium (Ti), palladium (Pd), platinum (Pt), magnesium (Mg), aluminum (Al) and their alloy.

Even in the second embodiment of the present disclosure, the thickness $H_1$ of the barrier layer 250 may be equal to or larger than about 10 Å. In the above-described range of thickness, the barrier layer 250 may magnetically decouple the second magnetic layer 140 and the magnetic field adjustment layer 160 from each other, and may reduce the stray field.

Figure 6:
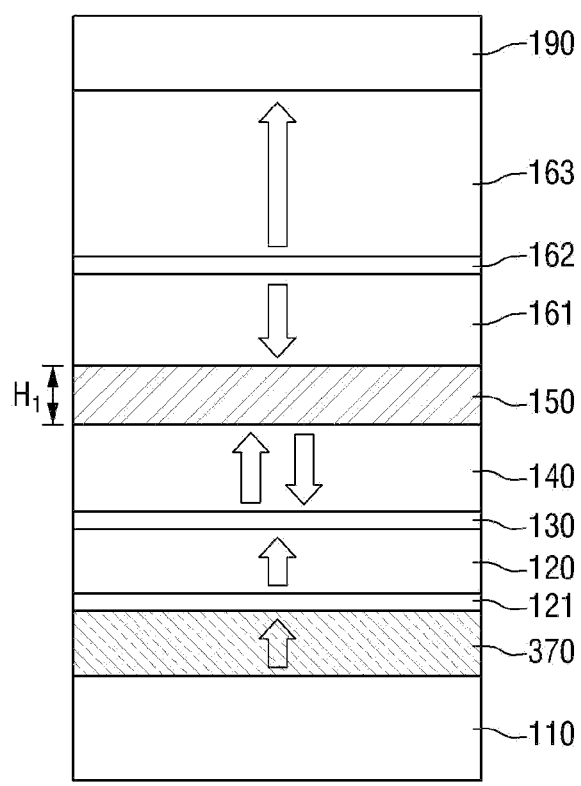
FIG. 6 is a schematic cross-sectional view of an MTJ element constructed according to a further embodiment of the present disclosure.
Figure 7:
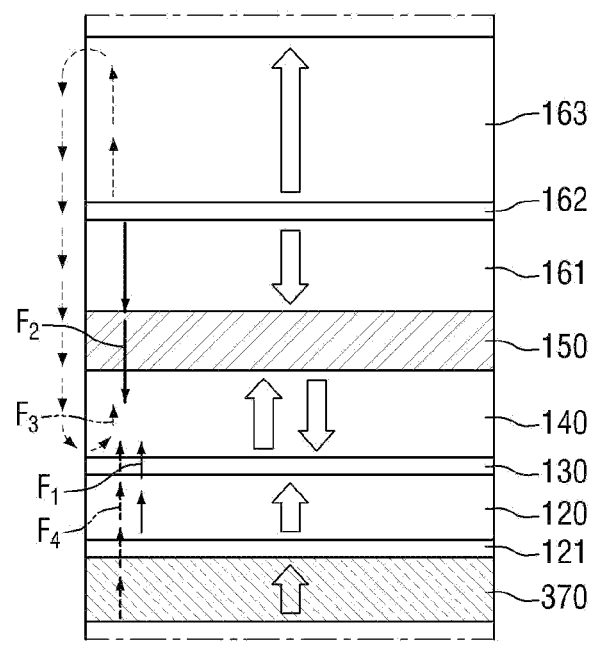
FIG. 7 is a cross-sectional view of a portion of the MTJ element of FIG. 6, schematically illustrating a stray field applying state in the MTJ element of that embodiment.

Hereinafter, with reference to FIGS. 6 and 7, an MTJ element according to a third embodiment of the present disclosure will be described. FIG. 6 is a cross-sectional view of an MTJ element according to a third embodiment of the present disclosure, and FIG. 7 is a view schematically illustrating a stray field applying state in a magnetic tunnel junction element according to a third embodiment of the present disclosure. The same drawing reference numerals are used for the constituent elements which are substantially the same as those according to the first embodiment, and the detailed description of the corresponding constituent elements will be omitted. The magnetic tunnel junction element according to the third embodiment of the present disclosure is different from that according to the first embodiment of the present disclosure on the point that a fifth magnetic layer 370 is included.

The fifth magnetic layer 370 may be formed adjacent, e.g., on a lower portion of the seed layer 121. The fifth magnetic layer 370 may have a perpendicular magnetic anisotropy, and may be magnetized parallel to the first magnetic layer 120. For example, the fifth magnetic layer 370 may be magnetized in the first direction.

The fifth magnetic layer 370 may reduce or offset the stray field that is applied to the second magnetic layer 140. Referring to FIG. 7, stray fields $$(\vec{F_1}, \vec{F_2}, \vec{F_3}, \vec{F_4})$$

are generated at edges of the first magnetic layer 120, the third magnetic layer 161, the fourth magnetic layer 163, and the fifth magnetic layer 370, which are formed of a magnetic substance, and these stray fields $$(\vec{F_1}, \vec{F_2}, \vec{F_3}, \vec{F_4})$$

may be applied to the second magnetic layer 140. The stray fields $$(\vec{F_1}, \vec{F_3}, \vec{F_4})$$

from the first magnetic layer 120, the fourth magnetic layer 163, and the fifth magnetic layer 370, which are magnetized in the first direction, are applied to the second magnetic layer 140 in the first direction, and the stray field $$(\vec{F_2})$$

from the third magnetic layer 161 which is magnetized in the second direction is applied to the second magnetic layer 140 in the second direction. At this time, if the stray field $$(\overrightarrow{F_2})$$

from the third magnetic layer 161 is larger than the sum of the stray fields $$(\overrightarrow{F_1}, \overrightarrow{F_3})$$

from the first magnetic layer 120 and the fourth magnetic layer 163, the stray fields are not offset as a whole, and the remaining stray field in the second direction may be applied to the second magnetic layer 140. However, the magnetic tunnel junction element according to the third embodiment of the present disclosure further includes the fifth magnetic layer 370 that is magnetized in the first direction, and can completely offset the stray field in the second direction that is generated from the third magnetic layer 140. That is, the stray field of $$\overrightarrow{F_1} + \overrightarrow{F_3} + \overrightarrow{F_4}$$

becomes almost the same as the stray field of $$\overrightarrow{F_2},$$

and thus the stray field can be offset almost completely.

The fifth magnetic layer 370 may be formed of a ferromagnetic material. For example, an amorphous base rare earth element alloy, a multilayer thin film in which ferromagnetic metal (FM) and nonmagnetic metal (NM) are alternately laminated, an alloy having an L10 type crystal structure, or a cobalt base alloy may be used. Specifically, as the amorphous base rare earth element alloy, an alloy, such as TbFe, TbCo, TbFeCo, DyTbFeCo, or GdTbCo, may be used. As the multilayer thin film in which the ferromagnetic metal and the nonmagnetic metal are alternately laminated, Co/Pt, Co/Pd, CoCr/Pt, Co/Ru, Co/Os, Co/Au, or Ni/Cu may be used. Further, as the alloy having the L10 type crystal structure, $Fe_{50}Pt_{50}$, $Fe_{50}Pd_{50}$, $Co_{50}Pt_{50}$, $Fe_{30}Ni_{20}N_{50}$, or $Co_{30}Ni_{20}Pt_{50}$ may be used, and as the cobalt base alloy, CoCr, CoPt, CoCrPt, CoCrTa, CoCrPtTa, CoCrNb, or CoFeB may be used, but the alloy is not limited thereto.

Even in this embodiment of the present disclosure, the thickness $H_1$ of the barrier layer 150 may be equal to or larger than about 10 Å.

Figure 8:
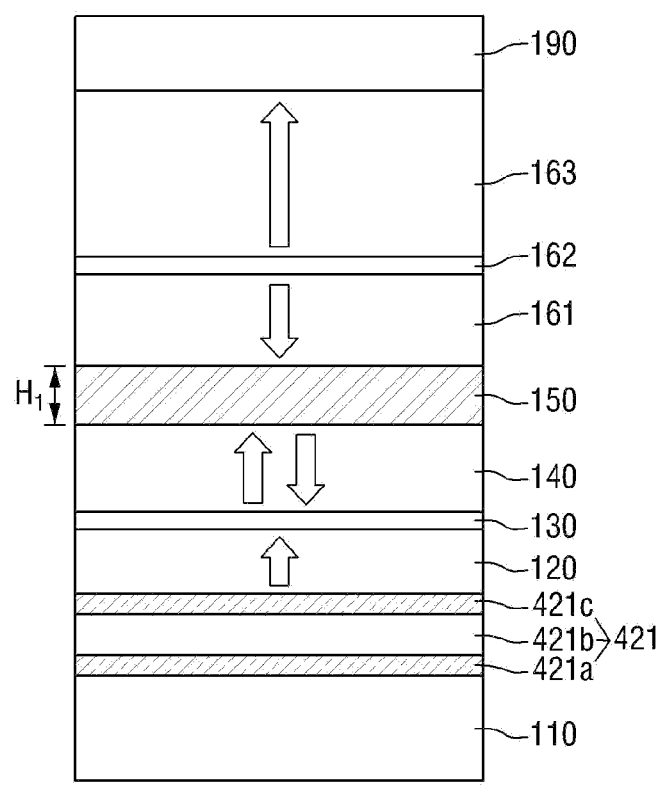
FIG. 8 is a schematic cross-sectional view of an MTJ element according to a still further embodiment of the present disclosure.

Hereinafter, with reference to FIG. 8, an MTJ element according to a fourth embodiment of the present disclosure will be described. FIG. 8 is a cross-sectional view of an MTJ element according to a fourth embodiment of the present disclosure. The same drawing reference numerals are used for the constituent elements which are substantially the same as those according to the first embodiment, and the detailed description of the corresponding constituent elements will be omitted. The magnetic tunnel junction element according to the fourth embodiment of the present disclosure is different from that according to the first embodiment of the present disclosure on the point that the seed layer 421 has a three-layer laminated structure.

Referring to FIG. 8, the seed layer 421 may have a structure in which a first metal layer 421a, an intermediate layer 421b, and a second metal layer 421c are sequentially laminated. The first metal layer 421a, the intermediate layer 421b, and the second metal layer 421c, which are sequentially laminated, may give a perpendicular anisotropy to the first magnetic layer 120.

The first metal layer 421a and the second metal layer 421c may be formed of a nonmagnetic metal, and specifically, may be formed of a metal selected from the group consisting of tantalum (Ta), ruthenium (Ru), titanium (Ti), palladium (Pd), platinum (Pt), magnesium (Mg), aluminum (Al) and their alloy.

Figure 9:
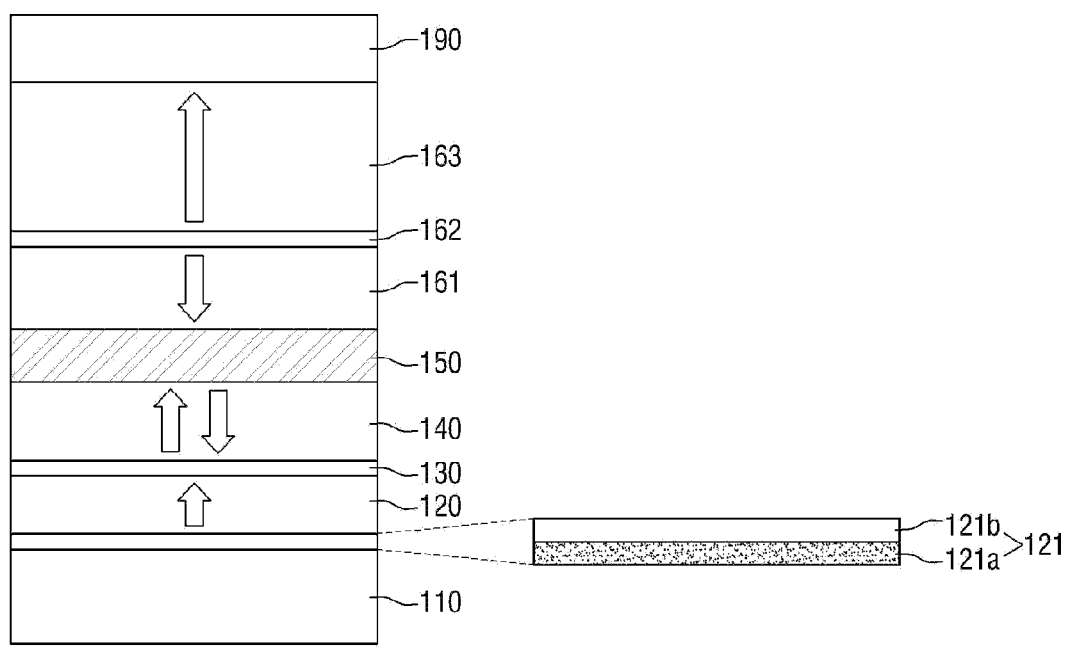
FIG. 9 is a schematic cross-sectional view of an MTJ element according to yet another embodiment of the present disclosure.

The intermediate layer 421b may be formed of a nonmagnetic metal, and specifically, may be formed of a signal metal selected from the group consisting of ruthenium (Ru), rhodium (Rh), osmium (Os), rhenium (Re), chrome (Cr) and their alloy. The intermediate layer 421b may be formed to be thicker than the first metal layer 421a and the second metal layer 421c. FIG. 9 exemplifies a case where the first metal layer 421a and the second metal layer 421c are formed of tantalum and titanium, and the intermediate layer 421b is formed of a ruthenium.

Hereinafter, referring to FIG. 9, an MTJ element according to a fifth embodiment of the present disclosure will be described. FIG. 9 is a cross-sectional view of an MTJ element according to a fifth embodiment of the present disclosure. The same drawing reference numerals are used for the constituent elements which are substantially the same as those according to the first embodiment, and the detailed description of the corresponding constituent elements will be omitted. The magnetic tunnel junction element according to the fifth embodiment of the present disclosure is different from that according to the first embodiment of the present disclosure on the point that the seed layer 121 has a double-layer laminated structure.

Referring to FIG. 9, the seed layer 121 may have a structure in which a metal oxide layer 121a and a metal layer 121b are sequentially laminated. FIG. 9 illustrates a structure in which the metal layer 121b is laminated on the metal oxide layer 121a, but the laminated structure is not limited thereto. It is also possible to provide a structure in which the metal oxide layer 121a is laminated on the metal layer 121b. The metal layer 121b may be formed of a single metal selected from the group consisting of tantalum (Ta), ruthenium (Ru), to titanium (Ti), palladium (Pd), platinum (Pt), magnesium (Mg), aluminum (Al) and their alloy. The metal oxide layer 121a may be formed of a single metal selected from the group consisting of tantalum (Ta), ruthenium (Ru), titanium (Ti), palladium (Pd), platinum (Pt), magnesium (Mg), aluminum (Al) and an oxide of their alloy.

Figure 10:
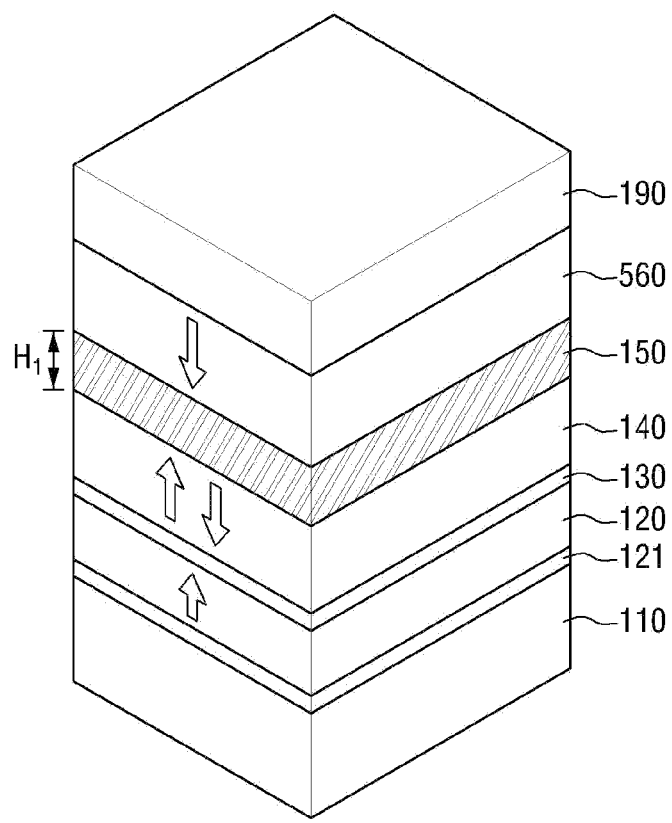
FIG. 10 is a schematic perspective view of an MTJ element according to a further embodiment of the present disclosure.
Figure 11:
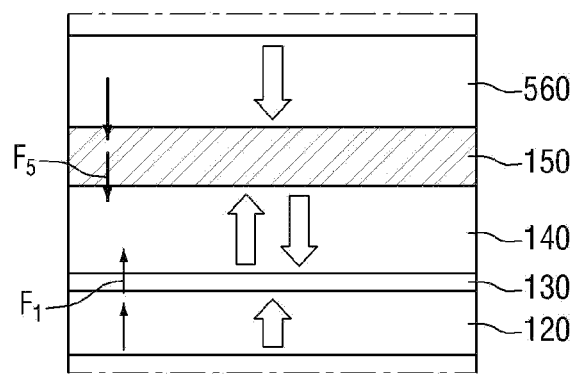
FIG. 11 is a cross-sectional view of a portion of the MTJ element of FIG. 10, schematically illustrating a stray field applying state in the MTJ element of this embodiment.
Figure 12:
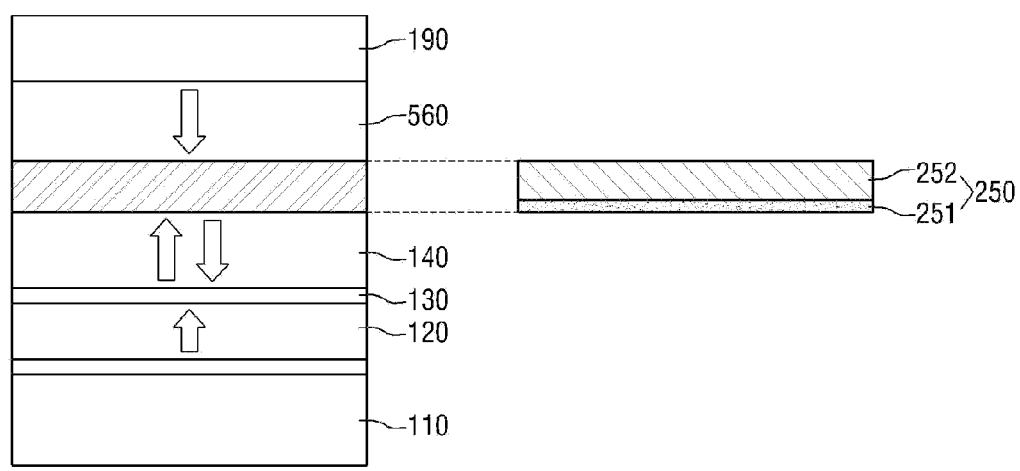
FIG. 12 is a cross-sectional view of a portion of the MTJ element of FIG. 10, illustrating an alternative configuration for the MTJ element according to this embodiment of the present disclosure.

Hereinafter, with reference to FIGS. 10 to 12, an MTJ element according to a sixth embodiment of the present disclosure will be described. FIG. 10 is a schematic view of an MTJ element according to a sixth embodiment of the present disclosure. FIG. 11 is a view schematically illustrating a stray field applying state in an MTJ element according to a sixth embodiment of the present disclosure, and FIG. 12 is a view illustrating a modified example of an MTJ element according to the sixth embodiment of the present disclosure. The same drawing reference numerals are used for the constituent elements which are substantially the same as those according to the first embodiment, and the detailed description of the corresponding constituent elements will be omitted. The magnetic tunnel junction element according to the sixth embodiment of the present disclosure is different from that according to the first embodiment of the present disclosure on the point that a magnetic field adjustment layer 560 is formed to be different from that according to the first embodiment of the present disclosure.

Referring to FIG. 10, the magnetic field adjustment layer 560 has the magnetic anisotropy that is perpendicular to its plane or a film surface thereof. Substantially all of the magnetic field adjustment layer 560 may be magnetized antiparallel to the first magnetic layer 120, and the magnetization direction may be pinned. That is, the magnetization direction may be pinned in the second direction.

The first magnetic layer 120 may be formed of a ferromagnetic material. For example, an amorphous base rare earth element alloy, a multilayer thin film in which ferromagnetic metal (FM) and nonmagnetic metal (NM) are alternately laminated, an alloy having an L10 type crystal structure, or a cobalt base alloy may be used. Since the detailed example thereof is as described above, the detailed description thereof will be omitted.

Referring to FIG. 11, the magnetic field adjustment layer 560 may reduce or offset the stray field that is applied to the second magnetic layer 140. This will be described in more detail. Since the first magnetic layer 120 and the magnetic field adjustment layer 560 are made of a magnetic substance, stray fields $$(\vec{F_1}, \vec{F_5})$$

may be generated at edges thereof. The stray field $$(\vec{F_5})$$

that is generated from the magnetic field adjustment layer 560 may be applied to the second magnetic layer 140 in the second direction, and the stray field $$(\vec{F_2})$$

that is generated from the first magnetic layer 120 may be applied to the to second magnetic layer 140 in the first direction. At this time, since the stray fields $$\vec{F_1} \text{ and } \vec{F_5}$$

are in opposite directions to each other, the stray fields may be offset, and if the sizes of the stray fields $$\vec{F_1} \text{ and } \vec{F_5}$$

are equal to or similar to each other, the stray fields can be offset.

The thickness $H_1$ of the barrier layer 150 may be equal to or larger than about 10 Å. Specifically, the thickness may be about 10 Å to about 50 Å, and more specifically, the thickness may be about 20 Å to about 50 Å. In the above-described range of thickness, the barrier layer 150 may magnetically decouple the second magnetic layer 140 and the magnetic field adjustment layer 560 from each other, and reduce the stray fields.

Referring to FIG. 12, the barrier layer 250 may be formed to have a structure in which the metal oxide layer 252 and the interlayer metal layer 251 are laminated in the same manner as the second embodiment. Further, although not illustrated in the drawing, the seed layer 121 may have a structure in which the first metal layer 421$a$, the intermediate layer 421$b$, and the second metal layer 421$c$ are sequentially laminated.

As described above, the MTJ element according to the embodiments of the present disclosure can offset or reduce the stray fields through the magnetic field adjustment layer 160 or 560. Further, due to the barrier layer 150 or 250, the magnetic field adjustment layer 160 or 560 does not exert a magnetic influence on the second magnetic layer 140.

Figure 13:
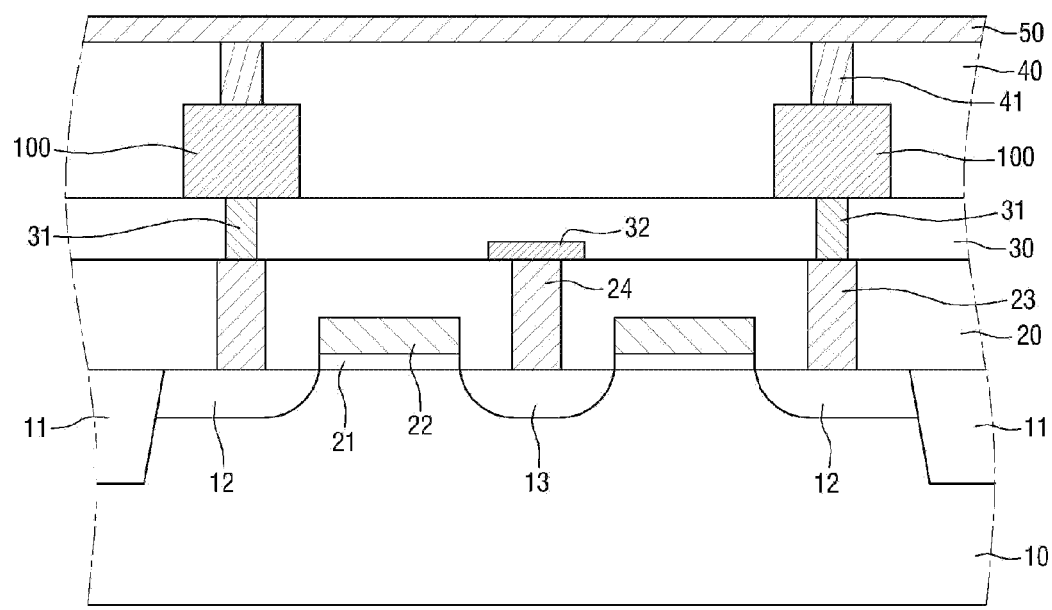
FIG. 13 is a schematic cross-sectional view of a magnetic memory device including an MTJ element constructed according to principles of the present disclosure.

Hereinafter, referring to FIG. 13, a magnetic memory device (magnetic random access memory (MRAM)), to which the MTJ element according to the embodiments of the present disclosure is applied, will be described. FIG. 13 is a cross-sectional view of a magnetic memory device including a magnetic tunnel junction element according the embodiments of the present disclosure. The magnetic memory device illustrated in FIG. 13 is an STT (Spin Transfer Torque) magnetic memory device. The ST magnetic memory device uses a phenomenon if the magnetization direction of the magnetic substance does not coincide with the spin direction of current in the case where high-density current having an aligned spin direction enters into the magnetic substance, the magnetization direction of the magnetic substance is forced to be aligned in the spin direction of the current. Since the STT to magnetic memory device does not require a digit line, the miniaturization of the magnetic memory device becomes possible.

The inventive principles may thus be relevant to any magnetic devices having, for example, single or multi-level cell structures, one or more free layers, multiple pinned layers, a synthetic anti-ferromagnetic (SAF) free layer, an anti-ferromagnetic (AF) coupling free layer, a SAF pinned layer, a single pinned layer, a giant magnetoresistance memory (GMR) barrier layer (formed of a thin layer of conductive material such as copper (Cu)) and/or a tunneling magnetoresistance memory (TMR) barrier layer (formed of an electrically non-conductive dielectric material such as MgO) TMR barriers and so on.

Also, the magnetization of the magnetic layer 140 of the magnetic device or the MTJ element may have components in-plane and perpendicular-to-plane according to some embodiments of the present disclosure.

Referring to FIG. 13, access devices are arranged in a predetermined region of a substrate 10.

The substrate 10 may be a silicon substrate, a gallium arsenide substrate, a silicon germanium substrate, a ceramic substrate, a quartz substrate, or a glass substrate for display, and may be an SOI (Semiconductor On Insulator) substrate. In this case, the access devices may be MOS transistors. In this case, the access transistors are arranged in an active region that is defined by a device isolation film 11 formed in a predetermined region of the substrate 10. Specifically, the access transistor is arranged in the active region, and may include a source region 13 and a drain region 12, which are spaced apart from each other, and a gate electrode 22 that is formed on an upper portion of a channel region between the source region 13 and the drain region 12. The gate electrode 22 may extend to cross the upper portion of the active region to serve as a word line. The gate electrode 22 is insulated from the active region by a gate insulating film 21.

A first interlayer insulating film 20 is formed on the upper portion of the substrate 10 having the access transistors, and a source line 32 is arranged on a predetermined region of the first interlayer insulting film 20 that corresponds to the source region 13. The source line 32 may be formed to extend in the same direction as the gate electrode 22. FIG. 13 illustrates the source region 13 that is shared between the neighboring access transistors, but the present disclosure is not limited thereto. The source region 13 and the drain region 12 may not be shared between the neighboring access transistors.

A source line contact and a landing contact 23 are formed in the first interlayer insulating film 20. The source line contact 24 electrically connects the source line 32 and the source region 13, and the landing contact 23 is formed on the drain region 12 to electrically connect an MTJ element to the drain region 12 of the access transistors.

A second interlayer insulating film 30 is formed on the first interlayer insulating film 20 on which the source line 32 is arranged. In the second interlayer insulating film 30, a lower electrode contact 31 that is electrically connected to the landing contact 24 is formed.

An MTJ element 100 according the embodiments of the present disclosure may be arranged on the second interlayer insulating film 30. Since the magnetic tunnel junction element 100 is as described above, the detailed description thereof will be omitted.

The magnetic tunnel junction element 100 and the drain region 12 are electrically connected through the landing contact 23 and the lower electrode contact 31.

A third interlayer insulating film 40 is formed over the MTJ element 100. On the third interlayer insulating film 40, a bit line 50 is arranged to cross the gate electrode 22. The bit line 50 and the magnetic tunnel junction element 100 are electrically connected through the upper electrode contact 41.

The first, second, and third interlayer insulating films 20, 30, and 40, for example, may be formed of a silicon oxide film or a silicon nitride oxide film. The landing contact 23, the source line contact 24, the source line 32, the lower electrode contact 31, the upper electrode contact 41, and the bit line 501 may be formed, for example, using W, Ru, Ta, Cu, Al, or doped polysilicon.

On the bit line 50, metal wires for electrical contact with circuits of a peripheral circuit portion (not illustrated) may be further formed.

Figure 14:
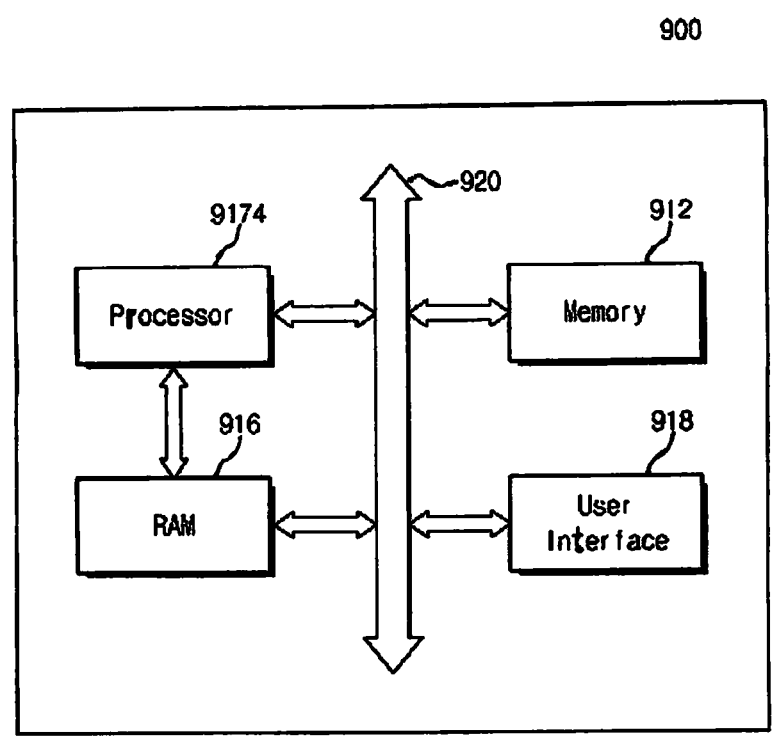
FIG. 14 is a schematic view of an electronic system in which a magnetic device according to an embodiment of the inventive concept is used.

FIG. 14 is a schematic view of an electronic system 900 in which the magnetic device according to an embodiment of the inventive concept is used. The electronic system 900 may be used for a mobile telecommunication device or a computer such as a portable notebook computer, Ultra-Mobile PCs (UMPC), and Tablet PCs. For example, the electronic system 900 may include a memory system 912, a processor 914, RAM 916, and a user interface 918, which may execute data communication using a bus 920. The processor 914 may be a microprocessor or a mobile processor (AP). The processor 914 may have a processor core (not illustrated) that can include a floating point unit (FPU), an arithmetic logic unit (ALU), and a digital signal processing core (DSP Core), or any combinations thereof. The processor 914 may execute the program and control the electronic system 900. The RAM 916 may be used as an operation memory of the processor 914. For example, the processor 914 or the RAM 916 may include a magnetic device according to example embodiments. Alternatively, the processor 914 and the RAM 916 may be packaged in a single package body. The user interface 918 may be used in inputting/outputting data to/from the electronic system 900. The memory system 912 may store codes for operating the processor 914, data processed by the processor 914, or externally input data. The memory system 912 may include a controller and a memory, and has substantially the same configuration as that of the memory card 800 shown in FIG. 11.

The electronic system 900 may be used in electronic controllers for a variety of electronic devices.

Although preferred embodiments of the present disclosure have been described for illustrative purposes, those skilled in the art will appreciate that various modifications, additions and substitutions are possible, without departing from the scope and spirit of the inventive concept as disclosed in the accompanying claims.

What is claimed is:

1. A magnetic device comprising:
    a first magnetic layer and a second magnetic layer adjacent lower and upper portions of an insulating layer, respectively, and the first magnetic layer and the second magnetic layer each having a perpendicular magnetic anisotropy;
    a magnetic field adjustment layer overlying the second magnetic layer and having a perpendicular magnetic anisotropy; and
    a barrier layer formed between the magnetic field adjustment layer and the second magnetic layer, said barrier layer comprising a metal alloy containing a metal selected from the group consisting of tantalum (Ta), ruthenium (Ru), titanium (Ti), palladium (Pd), platinum (Pt), magnesium (Mg), and aluminum (Al), and having a thickness between about 20 to 50Å;
    wherein the second magnetic layer and the magnetic field adjustment layer are magnetically decoupled from each other.

2. The magnetic device of claim 1, wherein the thickness of the second magnetic layer is equal to or larger than about 15Å.

3. The magnetic device of claim 1, wherein the magnetic field adjustment layer comprises a third magnetic layer, a fourth magnetic layer, and a nonmagnetic layer formed between the third magnetic layer and the fourth magnetic layer, and the third magnetic layer and the fourth magnetic layer are anti-ferromagnetically coupled to each other.

4. The magnetic device of claim 3, wherein the fourth magnetic layer is formed to be thicker than the third magnetic layer.

5. The magnetic device of claim 3, wherein the third magnetic layer and the fourth magnetic layer have a structure in which a ferromagnetic metal and a nonmagnetic metal are alternately laminated.

6. The magnetic device of claim 1, wherein an overall magnetization direction of the magnetic field adjustment layer and a magnetization direction of the first magnetic layer are anti-parallel to each other.

7. The magnetic device of claim 1, wherein a seed layer, which includes a single metal selected from the group consisting of tantalum (Ta), ruthenium (Ru), titanium (Ti), palladium (Pd), platinum (Pt), magnesium (Mg), aluminum (Al) and their alloy, is formed adjacent to the first magnetic layer.

8. The magnetic device of claim 7, further comprising a fifth magnetic layer having a perpendicular magnetic anisotropy and substantially the same magnetization direction as the first magnetic layer, said fifth magnetic layer formed adjacent the seed layer and on an opposite side of the seed layer as the first magnetic layer.

9. A magnetic device comprising:
    a first magnetic layer and a second magnetic layer disposed on opposite sides of an insulating layer, said first and second magnetic layers each having a perpendicular magnetic isotropy;

a seed layer formed adjacent the first magnetic layer;
a magnetic field adjustment layer arranged above the second magnetic layer and also having a perpendicular magnetic isotropy; and
a barrier layer formed between the magnetic field adjustment layer and the second magnetic layer, said barrier layer comprising a metal selected from the group consisting of tantalum (Ta), ruthenium (Ru), titanium (Ti), palladium (Pd), platinum (Pt), magnesium (Mg), and aluminum (Al), and having a thickness between about 20 to 50Å,
wherein the barrier layer comprises a metal alloy.

10. The magnetic device of claim 9, wherein the thickness of the second magnetic layer is equal to or larger than about 15Å.

11. The magnetic device of claim 9, wherein the magnetic field adjustment layer comprises a third magnetic layer, a fourth magnetic layer, and a nonmagnetic layer formed between the third magnetic layer and the fourth magnetic layer, and wherein the third magnetic layer and the fourth magnetic layer are anti-ferromagnetically coupled to each other.

12. The magnetic device of claim 11, wherein the fourth magnetic layer is thicker than the third magnetic layer.

13. The magnetic device of claim 11, wherein the third magnetic layer and the fourth magnetic layer have a structure in which a ferromagnetic metal and a nonmagnetic metal are alternately laminated.

14. The magnetic device of claim 9, wherein an overall magnetization direction of the magnetic field adjustment layer and a magnetization direction of the first magnetic layer are anti-parallel to each other.

15. The magnetic device of claim 9, wherein the seed layer includes a single metal selected from the group consisting of tantalum (Ta), ruthenium (Ru), titanium (Ti), palladium (Pd), platinum (Pt), magnesium (Mg), aluminum (Al) and their alloys.

16. The magnetic device of claim 9, further comprising a fifth magnetic layer having a perpendicular magnetic anisotropy and substantially the same magnetization direction as the first magnetic layer, said fifth magnetic layer formed adjacent the seed layer and opposite the first magnetic layer.

17. A magnetic device comprising:
a first magnetic layer and a second magnetic layer disposed on opposite sides of an insulating layer, said first and second magnetic layers each having a perpendicular magnetic isotropy;
a seed layer formed adjacent the first magnetic layer;
a magnetic field adjustment layer arranged above the second magnetic layer and also having a perpendicular magnetic isotropy, wherein the magnetic field adjustment layer comprises a third magnetic layer, a fourth magnetic layer, and a nonmagnetic layer formed between the third magnetic layer and the fourth magnetic layer, and wherein the third magnetic layer and the fourth magnetic layer are anti-ferromagnetically coupled to each other; and
a barrier layer formed between the magnetic field adjustment layer and the second magnetic layer, said barrier layer comprising a metal alloy including a metal selected from the group consisting of tantalum (Ta), ruthenium (Ru), titanium (Ti), palladium (Pd), platinum (Pt), magnesium (Mg), and aluminum (Al), and having a thickness between about 20 to 50Å;
a fifth magnetic layer having a perpendicular magnetic anisotropy and substantially the same magnetization direction as the first magnetic layer, said fifth magnetic layer formed adjacent the seed layer and on a side opposite the first magnetic layer.

* * * * *